United States Patent [19]

Madeley

[11] Patent Number: 4,611,163

[45] Date of Patent: Sep. 9, 1986

[54] TEMPERATURE COMPENSATED RESISTANCE BRIDGE CIRCUIT

[75] Inventor: David R. Madeley, Birmingham, England

[73] Assignee: Lucas Industries, England

[21] Appl. No.: 705,064

[22] Filed: Feb. 25, 1985

[30] Foreign Application Priority Data

Mar. 20, 1984 [GB] United Kingdom ............... 8407192

[51] Int. Cl.⁴ .................................................. H03H 1/00
[52] U.S. Cl. ..................................... 323/367; 323/907; 324/DIG. 1; 73/862.63
[58] Field of Search ............... 323/365, 367, 907, 352, 323/353; 324/62, 65 R, DIG. 1; 73/862.63, 862.65

[56] References Cited

U.S. PATENT DOCUMENTS

| | | | |
|---|---|---|---|
| 3,654,545 | 4/1972 | Demark | 323/280 |
| 3,831,042 | 8/1974 | La Claire | 323/365 X |
| 4,233,848 | 11/1980 | Sato et al. | 324/DIG. 1 |
| 4,444,056 | 4/1984 | Romo | 324/DIG. 1 |
| 4,532,468 | 7/1985 | Nishida et al. | 323/367 |

*Primary Examiner*—Peter S. Wong
*Attorney, Agent, or Firm*—Andrus, Sceales, Starke & Sawall

[57] ABSTRACT

A resistance bridge is temperature-compensated to provide acceptable values of sensitivity error and zero input error, by using a temperature-responsive current source from which are derived voltages which modify the bridge supply voltage and the bridge output voltage respectively. The output voltage is also modified to provide an acceptable sensitivity error by means of resistors in a circuit between output connections of the bridge and an output connection of the arrangement as a whole.

8 Claims, 2 Drawing Figures

$$V_{27} = \frac{V_{BH}(R10 + RPa) - (I.TH.R10.R5a)}{R10 + R5a + RPa} \quad (i)$$

$$V_B = \frac{I_T.R10.R5}{R10 + RP} + \frac{V_{27}(R10 + R5 + RP)}{R10 + RP} \quad (ii)$$

$$V_e = \frac{-I_T.RP.R10}{R10 + RP} + \frac{V_{27}.R10}{R10 + RP} \quad (iii)$$

TEMPERATURE COMPENSATED RESISTANCE BRIDGE CIRCUIT

FIELD OF THE INVENTION

This invention relates to a temperature compensated resistance bridge circuit and a method for providing such a circuit.

It is known to provide transducers which comprise four resistive strain gauges which are arranged as a Wheatstone bridge, the temperature coefficients of resistance (TCR) of the resistive elements being substantially constant over the temperature range at which the transducer is required to operate. However, as a result of manufacturing tolerances the resistances of the four bridge elements are rarely equal at a zero value of the input quantity to which the transducer is intended to respond, the transducer output voltage at zero input being referred to as offset error. Additionally the TCR's of the bridge elements are rarely equal, so that the offset error also changes with temperature. The transducer sensitivity, expressed as change in output voltage at unit supply voltage and a given change of input value, also changes with temperature.

DESCRIPTION OF RELATED ART

As disclosed in UK patent application No. 2096332A a resistance bridge circuit may be 25 temperature-compensated by connecting thereto four resistances which have constant values over the temperature range likely to be experienced, the values and positions of these resistances being determined from measurements, at a plurality of temperature levels and input values, of levels of voltage and resistance of the bridge. The method described in the above application, though necessary where the bridge is expected to encounter temperatures up to 180° C., is disadvantageous in that it requires accurate measurements, highly accurate compensating resistors and complex calculations.

It is an object of the present invention to provide a resistance bridge circuit which is temperature compensated by means which avoid the requirement for the aforesaid calculations and highly accurate resistors.

SUMMARY OF THE INVENTION

According to the invention there is provided a resistance bridge, means for applying a supply voltage across a first pair of opposite junctions of said bridge and means for deriving an output voltage from a second pair of opposite junctions of said bridge, said means for applying the supply voltage including means for modifying said supply voltage in dependence on the temperature of said bridge in a sense to oppose a change in sensitivity of the bridge with a change in the temperature thereof over a predetermined range, and said means for deriving said output voltage includes means for modifying the derived voltage in accordance with the bridge temperature, in a sense to maintain an offset error of the bridge substantially constant over said predetermined temperature range.

In a preferred embodiment said means for modifying the supply and output voltages comprises means for generating first and second voltages each of which varies substantially linearly with the temperature of said bridge, and there is provided means for modifying said supply voltage in dependence on said first voltage and a reference voltage, and means for rendering said output voltage dependent on the sum of said second voltage and the voltage across said second pair of bridge junctions.

BRIEF DESCRIPTION OF THE DRAWINGS

FIG. 2 shows equations for calculating voltage occurring in the circuit of FIG. 1.

DESCRIPTION OF THE PREFERRED EMBODIMENT

Figure 1:
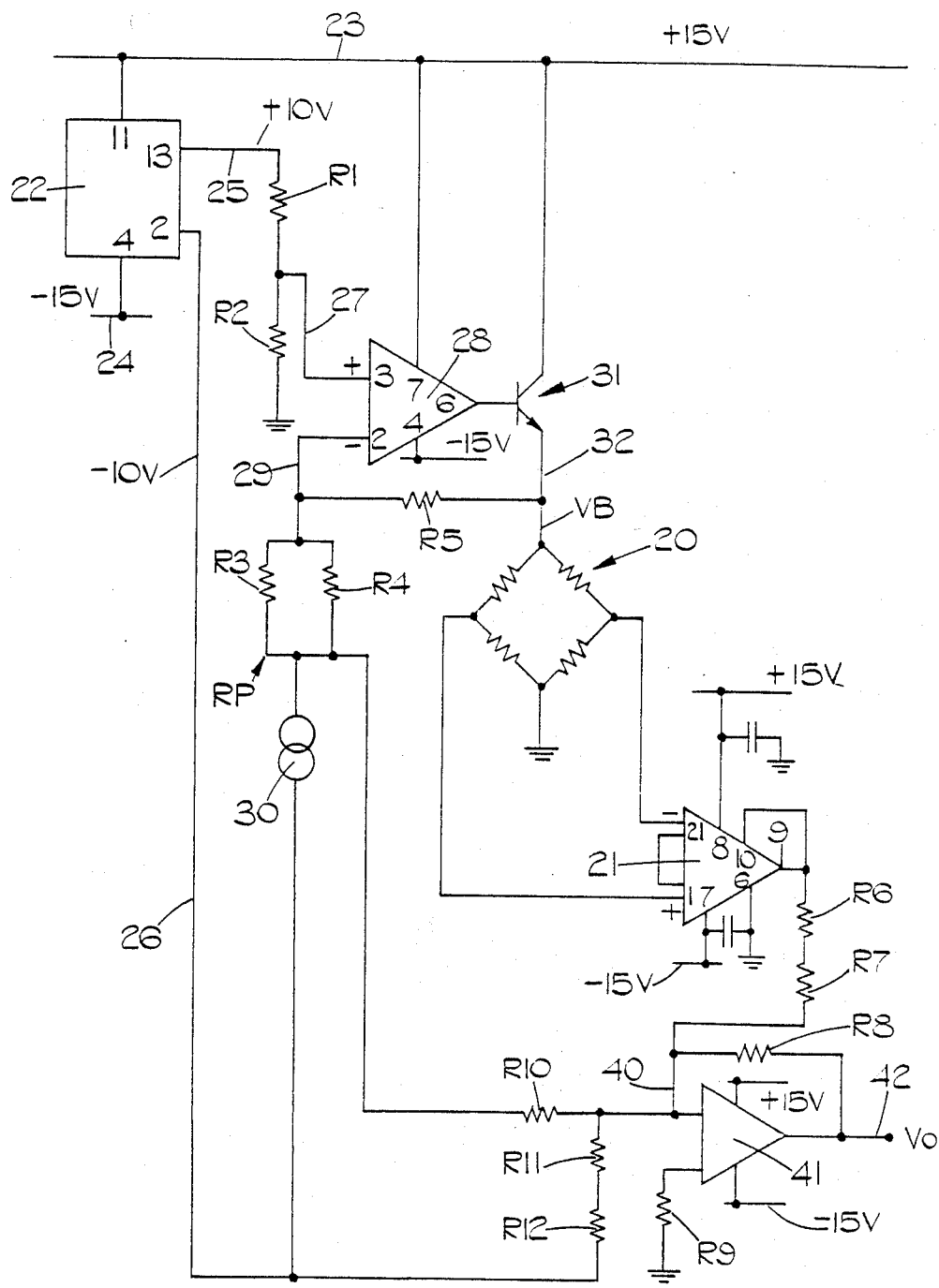
FIG. 1 is a diagram of a temperature compensated resistance bridge circuit according to the invention.

An embodiment of the invention will now be described by way of example only and with reference to the accompanying drawing which is a circuit diagram of a resistance bridge and associated component for temperature compensation.

In the present example the resistance bridge 20 comprises a silicon diaphragm which is locally doped with germanium to provide four resistances arranged as a Wheatstone bridge. The diaphragm forms part of a pressure transducer of the type available from Kulite Sensors Ltd. of Basingstoke, England. A supply voltage VB is applied across one pair of opposite junctions of the bridge 20 and an output voltage Vo is derived from the potential across the other pair of opposite junctions of the bridge 20, by way of an amplifier 21 which is available from Analog Devices Corporation under the designation AD524. The reference numerals shown at the terminals of this amplifier, and of circuit elements 22, 28, 41, indicate the pin numbers thereon to which connections are to be made. Elements 22, 28, 30,41 are also available from Analog Devices Corporation under designations referred to hereafter. In a bridge circuit of this type the sensitivity dVo/dP, as above defined, falls approximately linearly with increase in temperature. The offset voltage, as above defined, is always negative and becomes more negative with increasing temperature.

As shown, a voltage supply circuit 22, designation AD2702, is connected between a +15 V rail 23 and a −15 V rail 24 and provides output voltages of +10 V and −10 V on lines 25, 26 respectively. The line 25 is connected to ground through resistors R1, R2 arranged as a voltage divider. Resistor R1 has a value of 8K06 and the value of resistor R2 is determined as described below. The junction of resistors R1, R2 is connected by a line 27 to the non-inverting input of an amplifier 28, designation AD517. The inverting input of amplifier 28 is connected by a line 29 to parallel resistors R3, R4 and thence through a current source 30, designation AD590, to the −10 V rail 26. The value of the parallel arrangement of resistors R3, R4 is determined as described below. The current source 30 has an output which varies linearly with temperature and is located so as to be at the same temperature as the bridge 20. The output of amplifier 28 is connected to the base of a npn transistor 31 whose collector is connected to the rail 23 and whose emitter is connected by a line 32 to a supply junction of the bridge 20. A feedback resistor R5, whose value is determined as described below, interconnects the lines 29, 32. The arrangement of the amplifier 28, transistor 31 and resistor R5 is such as to cause the voltage V29 on line 29 to be urged to equality with the voltage V27 on line 27, the voltage V27 providing, in effect, a reference voltage.

The output of the amplifier 21 is connected through a series arrangement of resistors R6, R7 and a line 40 to the inverting input of an amplifier 41, similar to the amplifier 28. The output terminal 42 of amplifier 41 carries a voltage output signal Vo for the circuit as a whole. The terminal 42 is connected to the inverting input through a resistor R8. The value of resistor R8 is typically 20KO, and the value of resistor R7 is 0.95 of the value of R8. The value of resistor R6 is determined as described below. The non-inverting input of amplifier 41 is connected to ground through a 5KO resistor R9. The junction between the resistors R3, R4 and the current source 30 is connected to the line 40 through a resistor R10 whose value is equal to that of the resistor R8. The line 40 is connected to the −1O V line 26 through a series arrangement of resistors R11, R12 whose values are determined as described below.

The temperature-dependent errors in both the bridge 20 and amplifier 21 are approximately linear. It is therefore possible to compensate the system as a whole by treating the bridge 20 as the sole source of these errors. Moreover since the output voltage Vo, for a given sensed pressure, and the offset voltage are subject to negative-going errors with temperature rise, these errors can be corrected by voltage changes in the same sense. The transducer of which the bridge 20 forms part is connected to a pressure source by means of which the transducer can be subjected to a pressure which is as close to a vacuum as can reasonably be obtained, this pressure being referred to hereinafter as zero pressure and designated by the subscript L, and to a pressure, designated hereafter by the subscript P, which is 0.75 of full scale. The system is calibrated at these pressures and at 0° C. and 100° C., indicated hereafter by the subscripts C(cold) and H(hot) respectively.

A procedure for determining the value of the compensating resistors is as follows:

(1) Resistor R5 is short circuited. Resistors R3, R4, R10, R11 and R12 are rendered open circuit. Resistor R6 is set to 1 KO. Resistor R2 is replaced by a decade resistance box which is maintained an ambient temperature.

(2) The system is initially stabilised at 0° C. (Tc) and the value of R2 is adjusted by the resistance box to set the initial bridge supply voltage VB1 to 4.0 volts.

(3) The output voltages VL and VP at terminal 42 are measured at zero pressure and 0.75 full scale respectively.

(4) The sensitivity at 0° C., $Sc=(VP-VL)/P$ is calculated.

(5) The sensitivity error $E=(Sc-SR)/Sc$ is calculated, where SR is the required sensitivity in volts/unit pressure change.

(6) A new value VB2 of bridge supply voltage is calculated from $VB2=(1-E)VB1$.

(7) The value of R2 is adjusted by the resistance box so that the bridge supply voltage becomes VB2.

(8) Steps (3) to (7) above are repeated sequentially until $Sc=SR\pm0.00001$ volts/unit pressure change.

(9) The final values of VBc and VLc are recorded.

(10) The system is stabilised at 100° C. (TH).

(11) The output voltages VL and VP at terminal 42 are measured at zero pressure and 0.75 full scale respectively.

(12) The sensitivity at 100° C., $SH=(VP-VL)P$ is calculated.

(13) The sensitivity error $E=(SH-SR)/SH$ is calculated.

(14) A new value VB3 of bridge supply voltage is calculated from $VB3=(1-E)VB2$.

(15) The value of R2 is adjusted by the resistance box so that the bridge voltage is equal to VB3.

(16) Steps (11) to (15) are repeated sequentially until $SH=SR\pm0.00001$ volts/unit pressure change.

(17) The final bridge voltage VBH and output voltage VLH are recorded.

(18) The system is allowed to stabilise at room temperature, e.g. 18° C.

(19) Resistor R10 is fitted to the circuit.

(20) The resistance RP of the parallel arrangement of the resistors R3 and R4 is calculated from:

$$RP=R10.VR/(I.R10-VR)$$

where:
resistance values are in kilohms
I is the current/temperature characteristic of the source 30 in u A/°C., and $$VR=(VLc-VLH)/(TH-Tc) \text{ in mV/°C.}$$

(21) A combination of resistors R3 and R4 is selected to give the closest obtainable approximation RPa to the calculated value of RP.

(22) The value of resistor R5 is calculated from $$R5=VBs\ (R10+RPa)/I.R10$$

where $$VBs=(VBH-VBc)/(TH-Tc).$$

(23) A resistor having the nearest obtainable value R5a to the calculated value R5 is fitted in place of the short circuit provided in step (1) above.

(24) The value of R2 is calculated from $$R2=V27.R1/(10-V27)$$

since +10 volts is applied on the line 25 to R1 and where V27 has the value shown in equation (i) in FIG. 2.

(25) A resistor having the nearest obtainable value R2a to the calculated value is substituted for the resistance box previously fitted in step (1).

(26) With the system still stabilised at room temperature the resistance R6 is short-circuited.

(27) The output voltages VL and VP are measured at zero pressure and 0.75 full scale respectively.

(28) The sensitivity $S=(VP-VL)/P$ is calculated.

(29) The sensitivity error $E=(S-SR)/S$

(30) The value of R6 is calculated from $$R6=R7.E/(1-E)$$

(31) A resistor having the nearest obtainable value R6a is substituted for the resistor R6 originally inserted in step (1)

(32) A decade resistance box is connected in place of resistors R11, R12 which were made open circuit in step 1, and with zero pressure applied to the transducer the resistance box is adjusted until the output voltage at terminal 42 is equal to $Vd\pm0.001$ volts, where Vd is the desired output voltage at zero pressure.

(33) A resistor having the nearest value R12a below resistance box value given by the foregoing step is connected for R12, the resistance box being retained in place of R11.

(34) With zero pressure applied to the transducer the resistance box is adjusted until the voltage at terminal 42 = $Vd \pm 0.001$ volts.

(35) A resistor having the nearest obtainable value R11a to the preceding resistance box reading is fitted as R11.

The foregoing procedures result in a bridge voltage VB having the value shown in equation (ii) in FIG. 2, and an offset voltage Ve having the value shown in equation (iii). In both of these equations the factor $I_T$ represents the current output of the source 30 at a temperature of T°K. In both equations the first term corresponds to the slope of VB or Ve with temperature in volts/°C., and the second term is a constant.

The voltage V27 is fixed as a reference voltage by resistor R2, and the supply voltage VB is dependent, inter alia, on V27 and V29, and on the current through resistor R5 this current being in turn dependent on the temperature characteristic of the source 30. The voltage Vo is dependent on the sum of the voltages applied to line 40, and these include voltages arising from the currents in resistors R10, R11, R12, the first of these also being dependent on the temperature characteristic of the source 30.

I claim:

1. A temperature compensated resistance bridge circuit, comprising a resistance bridge, means for applying a supply voltage across a first pair of opposite junctions of said bridge, a first amplifier for deriving a first output voltage from a second pair of opposite junctions of said bridge, means connected to one only of said first pair of terminals for modifying said supply voltage in dependence on the temperature of said bridge in a sense to oppose a change in sensitivity of the bridge with a change in the temperature thereof over a predetermined range, and means for deriving a second output voltage from the sum of said first output voltage and a single control voltage which is dependent on the bridge temperature, in a sense to maintain an offset error of the bridge substantially constant over said predetermined temperature range.

2. A temperature compensated resistance bridge circuit, comprising a resistance bridge, means for applying a supply voltage across a first pair of opposite junctions of said bridge and means for deriving an output voltage from a second pair of opposite junctions of said bridge, said means for applying the supply voltage including means for modifying said supply voltage in dependence on the temperature of said bridge in a sense to oppose a change of sensitivity of the bridge with a change in the temperature thereof over a predetermined range, said means for deriving said output voltage including means for modifying the derived voltage in accordance with the bridge temperature, in a sense to maintain an offset error of the bridge substantially constant over said predetermined temperature range, said means for modifying the supply and output voltages comprising means for generating first and second voltages each of which varies substantially linearly with the temperature of said bridge, and there is provided means for modifying said supply voltage in dependence on said first voltage and a reference voltage, and means for rendering said output voltage dependent on the sum of said second voltage and the voltage across said second pair of bridge junctions.

3. A circuit as claimed in claim 2 in which said means for generating said first and second voltages includes a temperature-dependent current source which is located so as to be at substantially the same temperature as that of said bridge.

4. A circuit as claimed in claim 3 in which said means for generating the first voltage further comprises a first difference amplifier, means for applying a reference voltage to one input of said amplifier, a first resistance connecting said current source to a second input of said difference amplifier, means for regulating said bridge supply voltage in response to an output from said amplifier, and a second, feedback resistance between said second input and a connection of said supply voltage to said bridge.

5. A circuit as claimed in claim 3 or claim 4 in which said means for generating said second voltage comprises third and fourth resistances connected in parallel with said current source, said second voltage being derived from the junction of said third and fourth resistances.

6. A circuit as claimed in claim 3 or 4 which includes a second amplifier for providing a third voltage dependent on the voltage across said second pair of opposite junctions of the bridge, and a third amplifier responsive to the sum of said second and third voltages for generating said output voltage.

7. A method of providing temperature compensation for a device which comprises a resistance bridge and means for applying a supply voltage to two terminals of said bridge, said bridge having two further terminals from which an output voltage can be derived by way of an output resistance path, said method comprising (i) maintaining the bridge at a first temperature and varying the value of an input quantity to which the bridge is required to respond, and calculating the sensitivity error from readings of the bridge output voltage, (ii) calculating and applying to the bridge a new level of supply voltage which will reduce the sensitivity error, (iii) repeating steps (i) and (ii) until an acceptable level of sensitivity error is reached, (iv) maintaining the bridge at a second temperature, varying the value of said input quantity and calculating the sensitivity error from output voltage readings so obtained, (v) calculating and applying to the bridge a new supply voltage level which will reduce the sensitivity error, (vi) repeating steps (iv) and (v) until an acceptable level of sensitivity error is obtained, (vii) connecting a temperature-responsive current source and a first resistance in series, said first resistance being between said current source and an output end of said output resistance path, (viii) calculating the value of a second resistance from the current/temperature characteristic of said source, the value of said first resistance and the change of output voltage with temperature at a constant value of said input quantity, calculating the value of a third resistance from the value of said first resistance the change with temperature of said supply voltage and the current/temperature characteristic of said source, (ix) fitting said second and third resistances in series with said source to provide a first temperature responsive voltage for modifying said supply voltage, (x) calculating from the value of said first resistance the value of a desired reference voltage for said supply voltage applying means and adjusting said reference voltage to correspond substantially to its calculated value,
(xi) subjecting said bridge and said current source to a temperature intermediate said first and second temperatures,
(xii) measuring the bridge output voltage at a plurality of levels of said input quantity, and calculating the sensitivity error and a desired resistance value of said output path from the measurements so obtained,
setting the resistance of said output path to its desired value,
(xiv) connecting a fourth resistance in series with said first resistance so that said first and fourth resistances are in parallel with said current source, a second temperature-responsive voltage being derived from the junction of said first and fourth resistances,
(xv) applying a low value of said input quantity and varying the value of said third resistance until a desired output voltage is obtained.

8. A circuit as claimed in claim 5 includes a second amplifier for providing a third voltage dependent on the voltage across said second pair of opposite junctions of the bridge, and a third amplifier responsive to the sum of said second and third voltages for generating said output voltage.

* * * * *

UNITED STATES PATENT AND TRADEMARK OFFICE
CERTIFICATE OF CORRECTION

PATENT NO. : 4,611,163

DATED : September 9, 1986

INVENTOR(S) : DAVID R. MADELEY

It is certified that error appears in the above-identified patent and that said Letters Patent is hereby corrected as shown below:

In Column 1, line 28, after "may be" delete "25"

In Column 3, line 57, after "SR" delete "+" and insert --$\pm$--

In Claim 8, column 8, line 8, after "claim 5" insert --which--

Signed and Sealed this

Tenth Day of February, 1987

*Attest:*

DONALD J. QUIGG

*Attesting Officer*      *Commissioner of Patents and Trademarks*